US012713732B2

(12) United States Patent
Tsunoda et al.

(10) Patent No.: US 12,713,732 B2
(45) Date of Patent: Aug. 18, 2026

(54) LIGHT RECEIVING ELEMENT AND INFRARED IMAGING DEVICE

(71) Applicant: Fujitsu Limited, Kawasaki (JP)

(72) Inventors: Koji Tsunoda, Atsugi (JP); Kazuo Ozaki, Zama (JP)

(73) Assignee: Fujitsu Limited, Kawasaki (JP)

(*) Notice: Subject to any disclaimer, the term of this patent is extended or adjusted under 35 U.S.C. 154(b) by 413 days.

(21) Appl. No.: 18/364,804

(22) Filed: Aug. 3, 2023

(65) Prior Publication Data

US 2024/0136452 A1 Apr. 25, 2024
US 2024/0234601 A9 Jul. 11, 2024

(30) Foreign Application Priority Data

Oct. 20, 2022 (JP) ................................ 2022-168344

(51) Int. Cl.
*H10F 77/14* (2025.01)
*H10F 77/124* (2025.01)

(52) U.S. Cl.
CPC ..... *H10F 77/1462* (2025.01); *H10F 77/1248* (2025.01)

(58) Field of Classification Search
CPC ............. H10F 77/1462; H10F 77/1248; H10F 77/146; H10F 77/124; H10F 77/14; H10F 30/223
See application file for complete search history.

(56) References Cited

U.S. PATENT DOCUMENTS

2008/0073743 A1 3/2008 Alizadeh et al.
2012/0145996 A1* 6/2012 Ting .................... H10F 71/1276 257/E29.022
2013/0213462 A1 8/2013 Lewis et al.
2015/0311366 A1* 10/2015 Tsuji .................... H10F 71/127 438/94
2016/0172530 A1* 6/2016 Tsuji .................... H10F 71/127 438/94

FOREIGN PATENT DOCUMENTS

JP 2016-111294 A 6/2016
JP 2017-011168 A 1/2017

* cited by examiner

*Primary Examiner* — Calvin Y Choi
(74) *Attorney, Agent, or Firm* — ArentFox Schiff LLP

(57) ABSTRACT

A light receiving element includes a light receiving layer that includes a superlattice of an InAs layer and a GaSb layer, and an amorphous layer that covers a side wall surface of the light receiving layer. The amorphous layer contains In and As, and an amount of Ga and an amount of Sb contained in the amorphous layer are smaller than an amount of In and an amount of As contained in the amorphous layer.

9 Claims, 13 Drawing Sheets

LIGHT RECEIVING ELEMENT AND INFRARED IMAGING DEVICE

CROSS-REFERENCE TO RELATED APPLICATION

This application is based upon and claims the benefit of priority of the prior Japanese Patent Application No. 2022-168344, filed on Oct. 20, 2022, the entire contents of which are incorporated herein by reference.

FIELD

The embodiments discussed herein are related to a light receiving element and an infrared imaging device.

BACKGROUND

An infrared detector includes a light receiving element and a readout circuit. The light receiving element generates an amount of current corresponding to the intensity of an incident infrared ray. The readout circuit includes a capacitor and an amplifier, accumulates a current generated by the light receiving element in the capacitor as a charge, converts the accumulated charge into a voltage by the amplifier, amplifies the voltage, and outputs the voltage.

Dark current flows through the light receiving element even when there is no incident infrared ray. Dark current serves as a noise source, and as dark current increases, a ratio between a signal and noise (S/N ratio) decreases. When one light receiving element is processed and formed into a mesa type, dark current is roughly divided into in-plane components and peripheral (side wall) components. As a light receiving element is miniaturized due to an increase in the number of pixels of the light receiving element, the influence of peripheral components becomes relatively large. Accordingly, in order to obtain a good S/N ratio in the miniaturized light receiving element, it is important to reduce the peripheral components of dark current.

Japanese Laid-open Patent Publication No. 2017-011168, Japanese Laid-open Patent Publication No. 2016-111294, U.S. Patent Application Publication No. 2008/0073743, and U.S. Patent Application Publication No. 2013-0213462 are disclosed as related art.

SUMMARY

According to an aspect of the embodiments, a light receiving element including: a light receiving layer that includes a superlattice of an InAs layer and a GaSb layer; and an amorphous layer that covers a side wall surface of the light receiving layer, wherein the amorphous layer contains In and As, and an amount of Ga and an amount of Sb contained in the amorphous layer are smaller than an amount of In and an amount of As contained in the amorphous layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

As a material for an infrared absorption layer included in a light receiving element, a type II superlattice (T2SL) has been attracting attention. For example, a superlattice of InAs layers and GaSb layers is promising in terms of sensitivity, wavelength controllability, increasing the number of pixels, and the like. However, it is difficult to reduce the peripheral components of dark current flowing through the side wall surfaces of an infrared absorption layer including a superlattice of InAs layers and GaSb layers.

An object of the present disclosure is to provide a light receiving element and an infrared imaging device capable of reducing the peripheral components of dark current.

The inventors of the present application have made intensive studies to investigate the cause of the difficulty of reducing the peripheral components of dark current flowing through the side wall surfaces of an infrared absorption layer including a superlattice of InAs layers and GaSb layers. As a result, it has become clear that, in the process of manufacturing a light receiving element, Ga oxide and Sb oxide are generated on the side walls of the infrared absorption layer at the time of cleaning in deionized water or the like after etching, and the Sb oxide having relatively low thermal stability is deprived of oxygen by another element, thereby exhibiting metal-like properties. Based on such findings, the inventors of the present application have devised the following embodiments.

Hereinafter, embodiments of the present disclosure will be described in detail with reference to accompanying drawings. In the present specification and drawings, constituent elements having substantially the same functional configuration may be described with the same reference signs and redundant description thereof may be omitted.

First Embodiment

Figure 1:
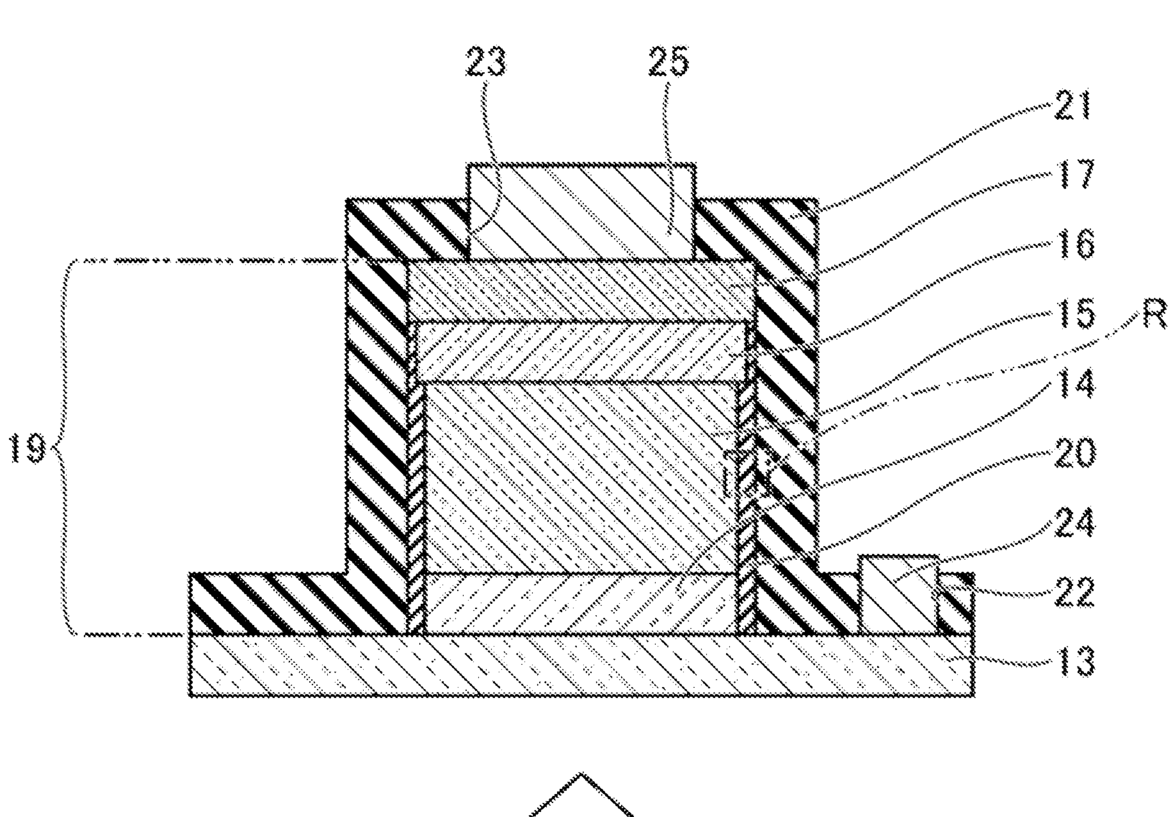
FIG. 1 is a sectional view (part 1) illustrating a light receiving element according to a first embodiment.
Figure 2:
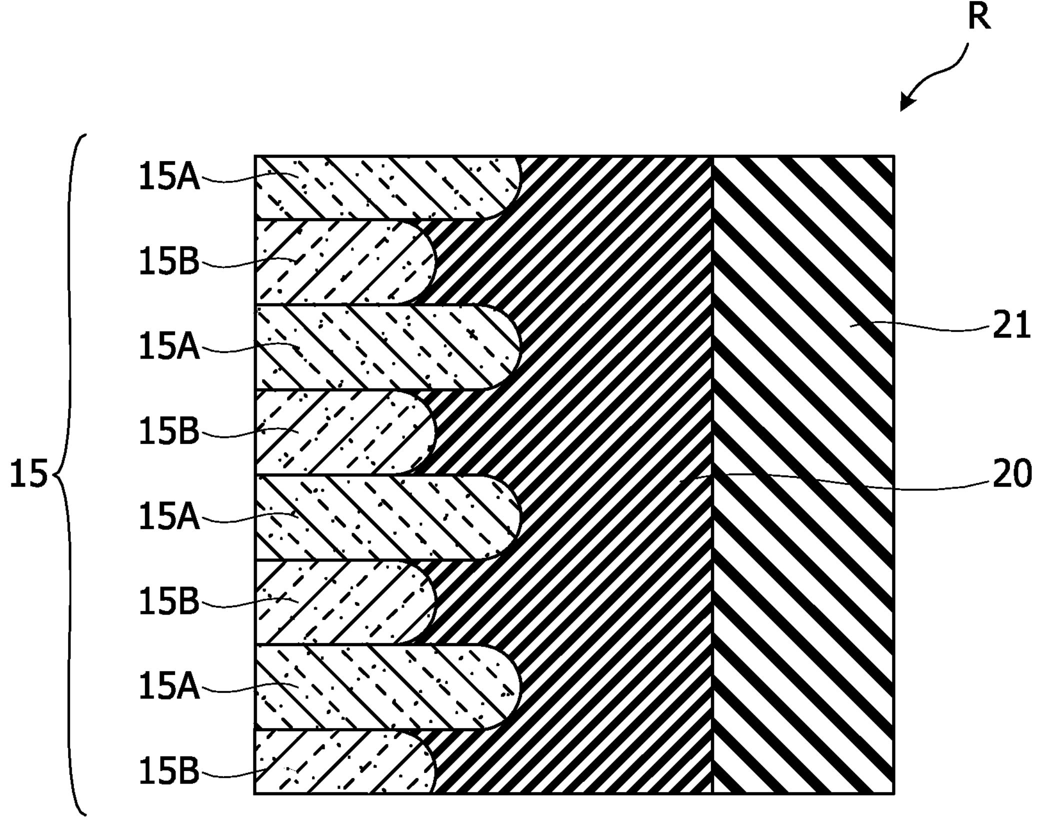
FIG. 2 is a sectional view (part 2) illustrating the light receiving element according to the first embodiment.

A first embodiment will be described. The first embodiment relates to a light receiving element. FIG. 1 and FIG. 2 are sectional views illustrating the light receiving element according to the first embodiment. FIG. 2 corresponds to an enlarged view of region R in FIG. 1.

As illustrated in FIG. 1, a light receiving element 1 according to the first embodiment includes a lower contact layer 13, an electron barrier layer 14, an infrared absorption layer 15, a hole barrier layer 16, an upper contact layer 17, an amorphous layer 20, a protective layer 21, a lower electrode 24, and an upper electrode 25.

For example, the lower contact layer 13 is an $InAs_{0.91}Sb_{0.09}$ layer. The lower contact layer 13 is doped with Si or Te as an n-type impurity at a concentration of $1\times10^{18}$ $cm^{-3}$, and the lower contact layer 13 has n-type conductivity. For example, the thickness of the lower contact layer 13 is 2 μm.

The electron barrier layer 14 is provided over the lower contact layer 13. For example, the electron barrier layer 14 includes a type II superlattice in which InAs layers and GaSb layers are alternately laminated. For example, the thickness of the InAs layers is 2.2 nm and the thickness of the GaSb layers is 2.1 nm. For example, the electron barrier layer 14 is doped with Be or Zn as a p-type impurity at a concentration of $5\times10^{17}$ $cm^{-3}$, and the electron barrier layer 14 has p-type conductivity. For example, the thickness of the electron barrier layer 14 is equivalent to 50 cycles when a laminate of an InAs layer and a GaSb layer is set as one cycle of the superlattice.

The infrared absorption layer 15 is provided over the electron barrier layer 14. As illustrated in FIG. 2, for example, the infrared absorption layer 15 includes a type II superlattice in which InAs layers 15A and GaSb layers 15B are alternately laminated. For example, the thickness of the InAs layers 15A is 4.2 nm and the thickness of the GaSb layers 15B is 2.1 nm. For example, the infrared absorption layer 15 is doped with Be or Zn as a p-type impurity at a concentration of $1\times10^{16}$ $cm^{-3}$, and the infrared absorption layer 15 has p-type conductivity. For example, the thickness of the infrared absorption layer 15 is equivalent to 400 cycles when a laminate of the InAs layer 15A and the GaSb layer 15B is set as one cycle of the superlattice. As illustrated in FIG. 2, in plan view from a direction perpendicular to the upper surface of the infrared absorption layer 15, the side wall surfaces of the GaSb layers 15B may be located inside the side wall surfaces of the InAs layers 15A. The infrared absorption layer 15 is an example of a light receiving layer.

The hole barrier layer 16 is provided over the infrared absorption layer 15. For example, the hole barrier layer 16 includes a type II superlattice in which InAs layers and AlSb layers are alternately laminated. For example, the thickness of the InAs layers is 4.6 nm and the thickness of the AlSb layers is 1.2 nm. For example, the hole barrier layer 16 is doped with Si or Te as an n-type impurity at a concentration of $5\times10^{17}$ $cm^{-3}$, and the hole barrier layer 16 has n-type conductivity. For example, the thickness of the hole barrier layer 16 is equivalent to 50 cycles when a laminate of an InAs layer and an AlSb layer is set as one cycle of the superlattice.

The upper contact layer 17 is provided over the hole barrier layer 16. For example, the upper contact layer 17 is an InAs layer. The upper contact layer 17 is doped with Si or Te as an n-type impurity at a concentration of $1\times10^{18}$ $cm^{-3}$, and the upper contact layer 17 has n-type conductivity. For example, the thickness of the upper contact layer 17 is 20 nm.

The electron barrier layer 14, the infrared absorption layer 15, the hole barrier layer 16, and the upper contact layer 17 are etched into a mesa shape. For example, the light receiving element 1 includes a mesa 19 including the electron barrier layer 14, the infrared absorption layer 15, the hole barrier layer 16, and the upper contact layer 17.

The amorphous layer 20 covers the side wall surfaces of the electron barrier layer 14 and the infrared absorption layer 15. The amorphous layer contains In and As. The amorphous layer 20 may further contain oxygen (O). The main components of the amorphous layer are In, As, and O. Ga, Sb, or both of Ga and Sb may be contained in the amorphous layer 20, but an amount of Ga (atomic %) and an amount of Sb (atomic %) contained in the amorphous layer 20 are smaller than an amount of In (atomic %) and an amount of As (atomic %) contained in the amorphous layer 20. Each of the amount of Ga (atomic %) and the amount of Sb (atomic %) contained in the amorphous layer 20 is preferably 10 atomic % or less, more preferably 8 atomic % or less, and still more preferably 5 atomic % or less.

Although the amorphous layer 20 mainly covers the side wall surfaces of the electron barrier layer 14 and the infrared absorption layer 15, the amorphous layer 20 may include a portion covering the side wall surfaces of the hole barrier layer 16. However, the portion covering the side wall surfaces of the hole barrier layer 16 is thin. For example, the thickness from an end portion of an InAs layer included in the hole barrier layer 16 is at most 3 nm. Accordingly, the distance between the hole barrier layer 16 and the protective layer 21 is 3 nm or less. The portion of the amorphous layer 20 covering the side wall surfaces of the hole barrier layer 16 does not contain Ga, but contains Al.

The protective layer 21 covers the side surfaces of the upper contact layer 17 and the hole barrier layer 16, the upper surface of the upper contact layer 17, and the upper surface of the lower contact layer 13. The protective layer 21 further covers the amorphous layer 20. For example, the protective layer 21 is a silicon dioxide ($SiO_2$) layer, a silicon oxynitride (SiON) layer, or a silicon nitride (SiN) layer. For example, the thickness of the protective layer 21 is about 500 nm.

An opening 22 that exposes a part of the upper surface of the lower contact layer 13 and an opening 23 that exposes a part of the upper surface of the upper contact layer 17 are formed in the protective layer 21. The lower electrode 24 is provided inside the opening 22, and the upper electrode 25 is provided inside the opening 23. For example, the lower electrode 24 includes a Ti film in contact with the lower contact layer 13, a Pt film over the Ti film, and an Au film over the Pt film. The lower electrode 24 is in ohmic junction with the lower contact layer 13. For example, the upper electrode 25 includes a Ti film in contact with the upper contact layer 17, a Pt film over the Ti film, and an Au film over the Pt film. The upper electrode 25 is in ohmic junction with the upper contact layer 17.

Next, a method of manufacturing the light receiving element 1 according to the first embodiment will be described. FIG. 3 to FIG. 7 are sectional views illustrating the method of manufacturing the light receiving element 1 according to the first embodiment.

Figure 3:
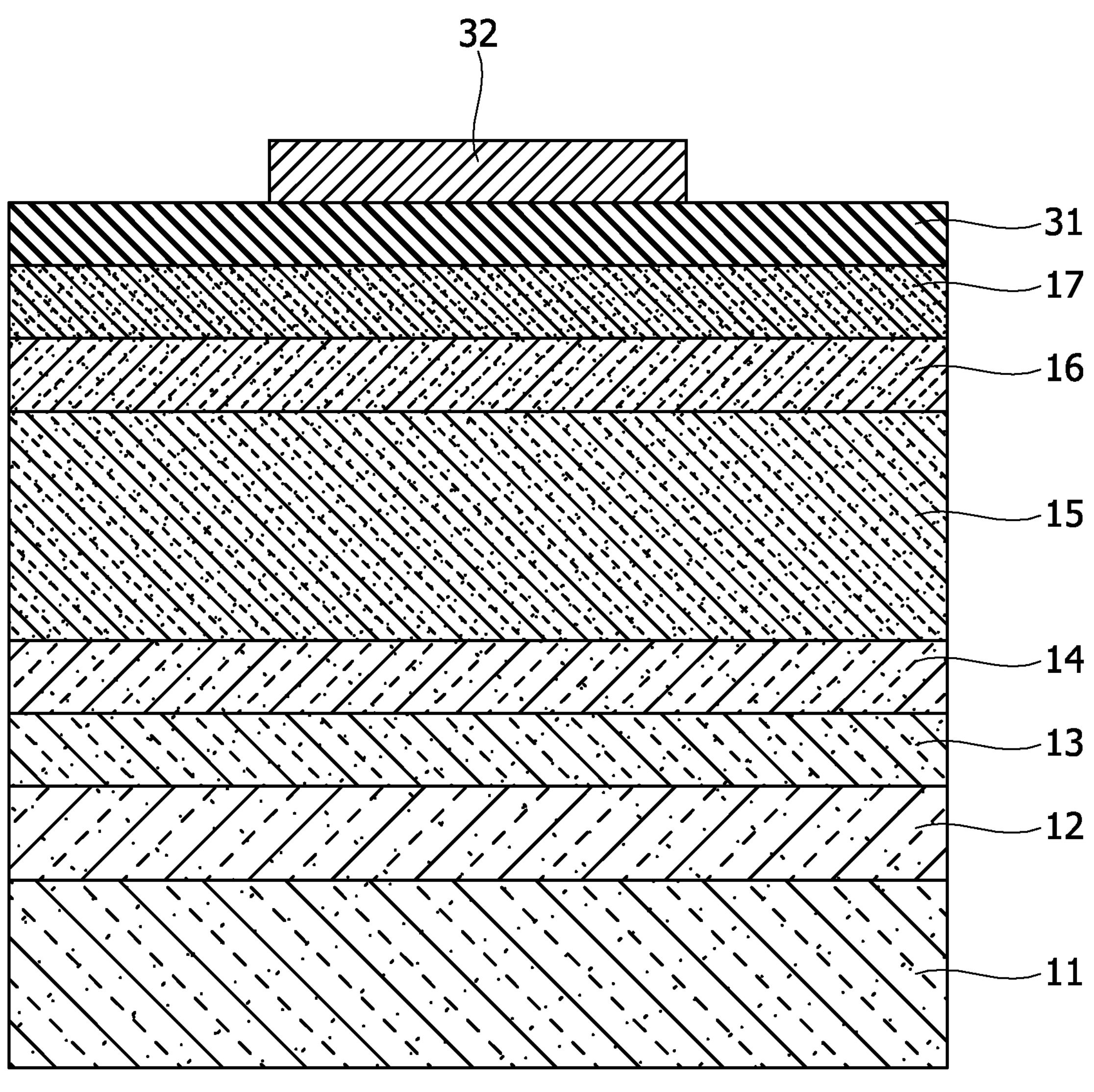
FIG. 3 is a sectional view (part 1) illustrating a method of manufacturing the light receiving element according to the first embodiment.

First, as illustrated in FIG. 3, a buffer layer 12, the lower contact layer 13, the electron barrier layer 14, the infrared absorption layer 15, the hole barrier layer 16, and the upper contact layer 17 are epitaxially grown over a substrate 11. In the following description, these semiconductor layers are epitaxially grown by a molecular beam epitaxy (MBE) method. These semiconductor layers may be epitaxially grown by a metal organic chemical vapor deposition (MOCVD) method or the like. For example, the thickness of the substrate 11 is about 600 μm.

Next, an SiON layer 31 is formed over the upper contact layer 17. For example, the SiON layer 31 is formed by a plasma CVD method. For example, the thickness of the SiON layer 31 is about 500 nm. After that, a resist mask 32 is formed over the SiON layer 31 by lithography. The resist mask 32 is formed so as to cover a region where the mesa 19 is to be formed.

Figure 4:
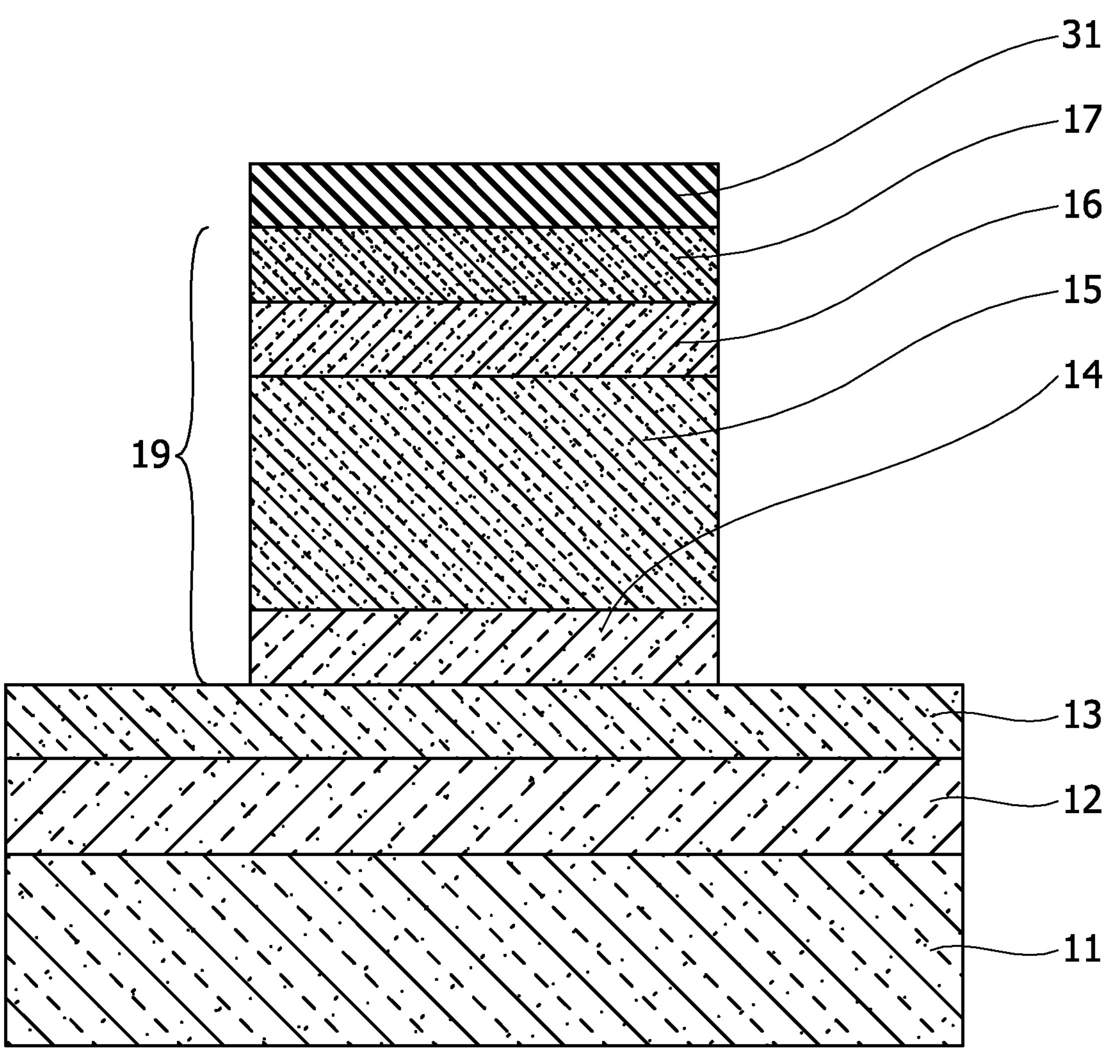
FIG. 4 is a sectional view (part 2) illustrating the method of manufacturing the light receiving element according to the first embodiment.

Subsequently, as illustrated in FIG. 4, a portion of the SiON layer 31 exposed from the resist mask 32 is etched. In this etching, for example, reactive ion etching (RIE) using a $CF_4$ gas and an Ar gas is performed. Next, the resist mask 32 is removed, and the upper contact layer 17, the hole barrier layer 16, the infrared absorption layer 15, and the electron barrier layer 14 are etched by using the remaining SiON layer 31 as a hard mask. In this etching, for example, RIE using a $BCl_3$ gas and an Ar gas is performed. In this etching, a pulse signal of Ga by secondary ions or the like is monitored, and an end point of the etching is detected by reduction of Ga. For example, the etching is terminated at a time point when the upper surface of the lower contact layer 13 not containing Ga is exposed. As a result of this etching, the mesa 19 including the upper contact layer 17, the hole barrier layer 16, the infrared absorption layer 15, and the electron barrier layer 14 is formed.

Figure 5:
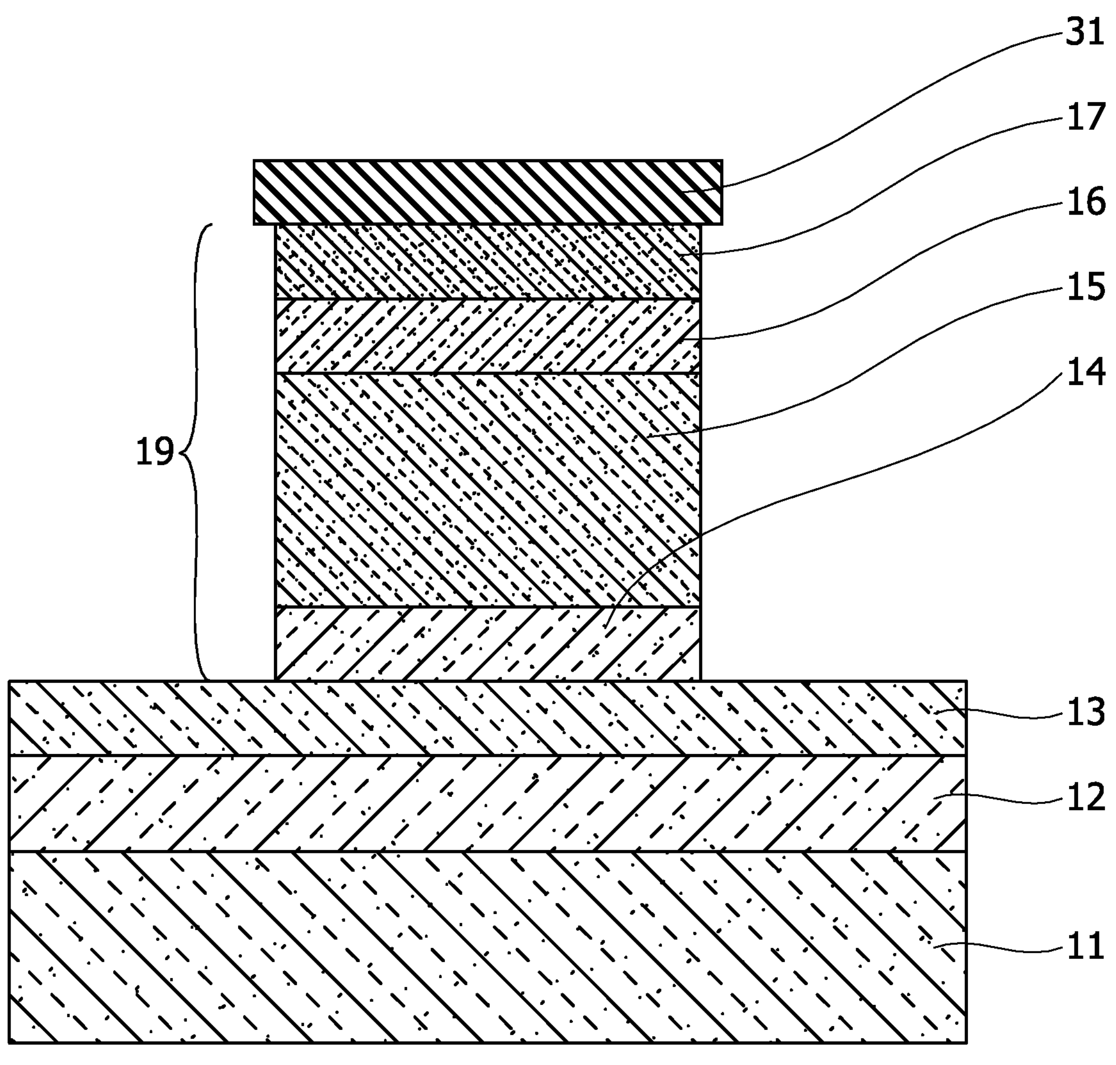
FIG. 5 is a sectional view (part 3) illustrating the method of manufacturing the light receiving element according to the first embodiment.

After that, as illustrated in FIG. 5, the side walls of the mesa 19 are etched by a thickness of about 50 nm by using a mixed solution of phosphoric acid, citric acid, hydrogen peroxide, and water, and a damaged layer on the side walls of the mesa 19 generated by RIE is removed. As a result, in the infrared absorption layer 15, the GaSb layers 15B are etched more preferentially than the InAs layers 15A, and as illustrated in FIG. 2, the side wall surfaces of the GaSb layers 15B are recessed inward from the side wall surfaces of the InAs layers 15A. Also in the electron barrier layer 14, the side wall surfaces of the GaSb layers are recessed inward from the side wall surfaces of the InAs layers.

Figure 6:
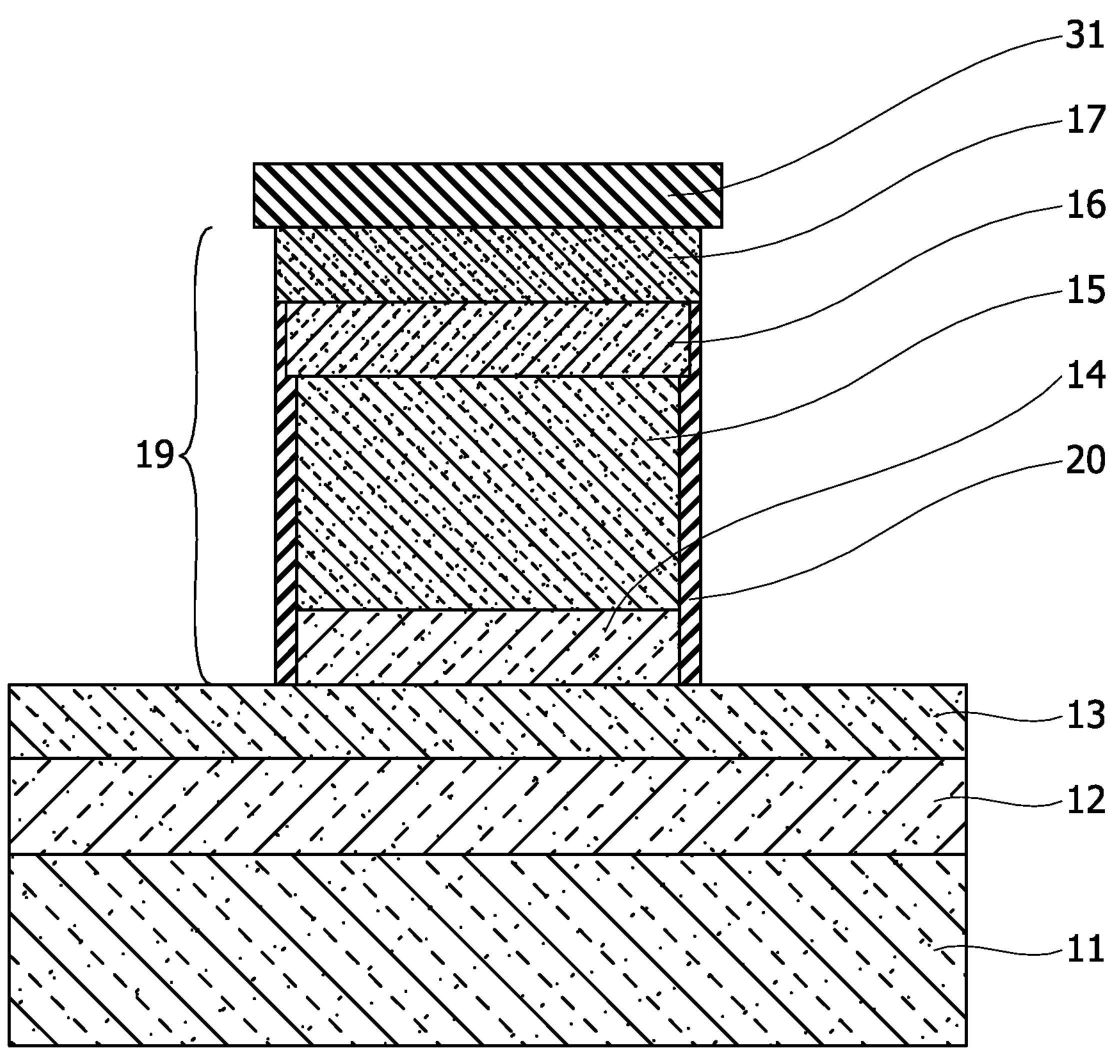
FIG. 6 is a sectional view (part 4) illustrating the method of manufacturing the light receiving element according to the first embodiment.

Subsequently, the side walls of the mesa 19 are processed by using a citric acid-based aqueous solution. As a result, as illustrated in FIG. 6, the amorphous layer 20 containing In and As is formed by using some of the InAs layers included in the electron barrier layer 14 and the infrared absorption layer 15. Although the amorphous layer 20 mainly covers the side wall surfaces of the electron barrier layer 14 and the infrared absorption layer 15, the amorphous layer 20 may be formed so as to include a portion covering the side wall surfaces of the hole barrier layer 16.

Figure 7:
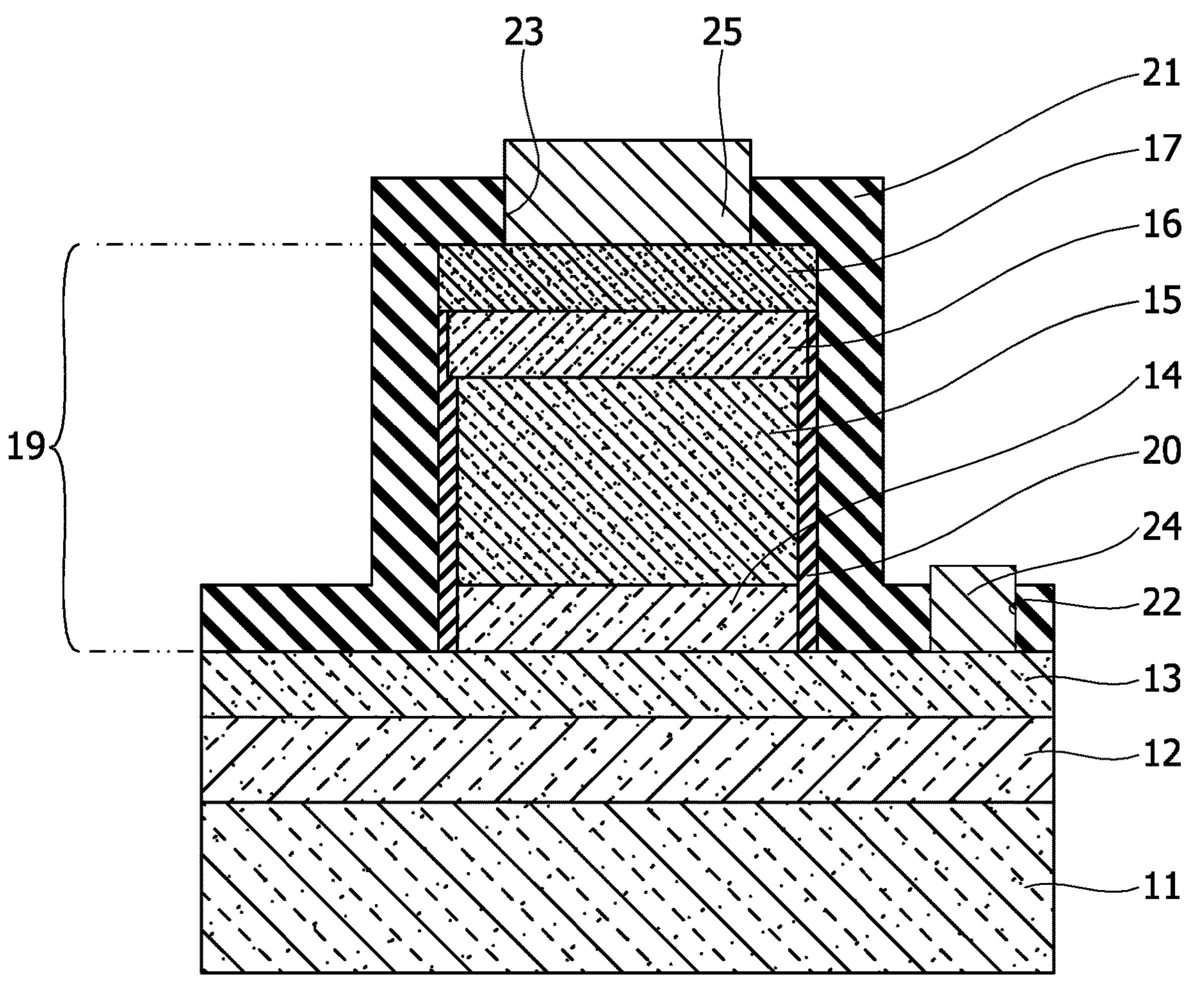
FIG. 7 is a sectional view (part 5) illustrating the method of manufacturing the light receiving element according to the first embodiment.

Next, as illustrated in FIG. 7, the SiON layer 31 is removed by using buffered hydrofluoric acid (BHF). After that, the protective layer 21 that covers the mesa 19 and the lower contact layer 13 is formed. For example, the protective layer 21 may be formed by a plasma CVD method using an $SiH_4$ gas and an $N_2O$ gas. Subsequently, the opening 22 that exposes a part of the upper surface of the lower contact layer 13 and the opening 23 that exposes a part of the upper surface of the upper contact layer 17 are formed in the protective layer 21. Next, the lower electrode 24 is formed inside the opening 22, and the upper electrode 25 is formed inside the opening 23. For example, the lower electrode 24 and the upper electrode 25 may be formed by a lift-off method in which lithography and a vapor deposition method are combined.

After that, by removing the substrate 11 and the buffer layer 12, the light receiving element 1 according to the first embodiment may be manufactured.

In the first embodiment, the side wall surfaces of the infrared absorption layer 15 are covered with the amorphous layer 20. The amorphous layer 20 contains In and As, and the amount of Ga (atomic %) and the amount of Sb (atomic %) contained in the amorphous layer 20 are smaller than the amount of In (atomic %) and the amount of As (atomic %) contained in the amorphous layer 20. For this reason, both during the process of manufacturing the light receiving element 1 and after the completion of the light receiving element 1, arrival of oxygen at the side wall surfaces of the electron barrier layer 14 and the infrared absorption layer 15 is suppressed, and generation of Ga oxide and Sb oxide is suppressed. Accordingly, a leakage current caused by the generation of Sb oxide may be suppressed, and the peripheral components of dark current for which the side wall surfaces of the electron barrier layer 14 and the infrared absorption layer 15 serve as the leakage paths may be reduced. Accordingly, even when the light receiving element 1 is miniaturized, a good S/N ratio may be obtained.

Figure 8:
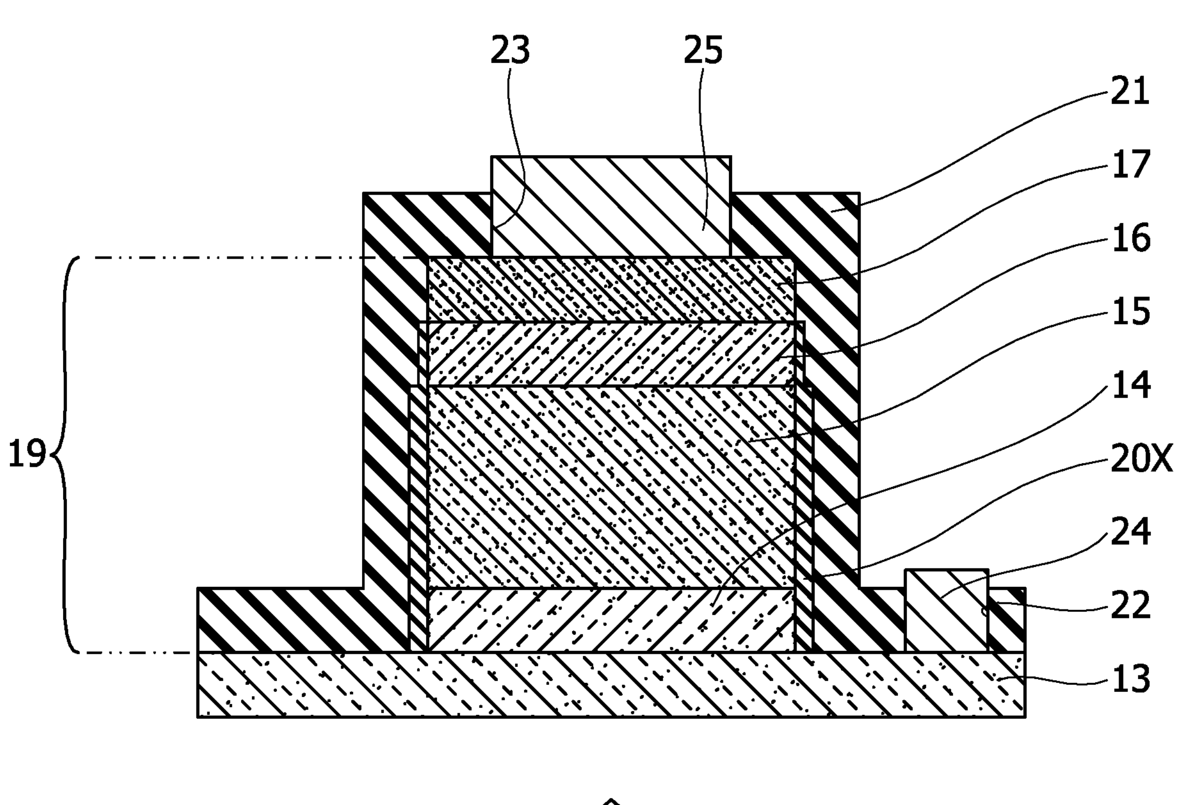
FIG. 8 is a sectional view illustrating a light receiving element according to a reference example.
Figure 8:
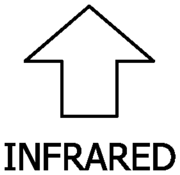

A reference example will be described for comparison with the first embodiment. FIG. 8 is a sectional view illustrating a light receiving element according to the reference example. FIG. 8 is not a diagram illustrating the related art.

A light receiving element 1X according to the reference example is manufactured by a method substantially similar to that in the first embodiment. The main difference from the first embodiment is that, in the manufacturing, cleaning in deionized water is performed immediately after removal of a damaged layer, and formation of the protective layer 21 and subsequent processing are performed without forming the amorphous layer 20. As illustrated in FIG. 8, the light receiving element 1X according to the reference example does not include the amorphous layer 20, but includes an amorphous oxide film 20X formed at the time of the cleaning in deionized water. The oxide film 20X covers the side wall surfaces of the electron barrier layer 14 including GaSb layers, the side wall surfaces of the infrared absorption layer 15 including GaSb layers, and the side wall surfaces of the hole barrier layer 16 not including GaSb layers. The oxide film 20X contains Sb oxide. GaSb is easily oxidized by the cleaning in deionized water, and the electron barrier layer 14 and the infrared absorption layer 15 also include Ga. For this reason, the portion of the oxide film 20X covering the side wall surfaces of the electron barrier layer 14 and the infrared absorption layer 15 also contains Ga oxide and is thicker than the portion covering the side wall surfaces of the hole barrier layer 16.

As described above, in the light receiving element 1X, the oxide film 20X includes a portion where the thermal stability of the Sb oxide contained in the oxide film 20X is low and the Sb oxide is decomposed to exhibit properties close to metals. Since the oxide film 20X is thick, dark current easily flows in the vicinity of the side walls of the infrared absorption layer 15. By contrast, since the present embodiment has a configuration in which Sb oxide is unlikely to be included, it is possible to reduce dark current due to Sb oxide.

An analysis result of a laminated structure manufactured in accordance with the first embodiment will be described. This laminated structure has a structure illustrated in FIG. 6.

Figure 9:
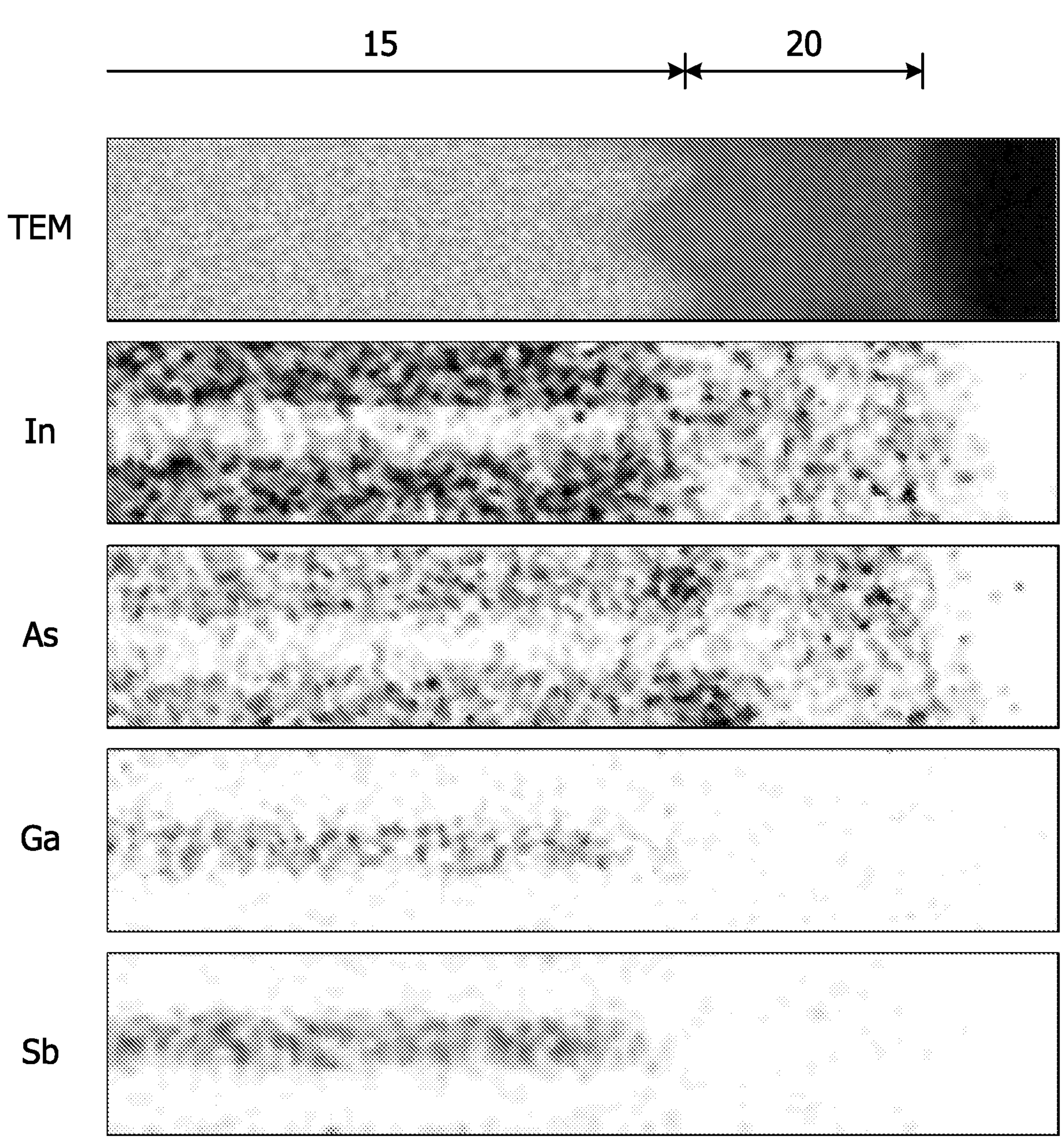
FIG. 9 is a diagram illustrating an analysis result of a laminated structure.

FIG. 9 is a diagram illustrating an analysis result of the laminated structure. "TEM" in FIG. 9 indicates an observation image by a transmission electron microscope (TEM). "In", "As", "Ga", and "Sb" in FIG. 9 indicate results of energy dispersive X-ray spectroscopy (EDX) of In, As, Ga, and Sb, respectively. The results of EDX analysis indicate that the element is present in a portion where there is a black dot. FIG. 9 illustrates observation results and analysis results of substantially the same location.

As illustrated in FIG. 9, in the observation image by TEM, crystals are observed in a portion corresponding to the infrared absorption layer 15, and no crystals are observed in a portion corresponding to the amorphous layer 20. According to the results of EDX analysis, a combination of In and As and a combination of Ga and Sb are alternately present in a portion corresponding to the infrared absorption layer 15. In the portion corresponding to the amorphous layer 20, In and As are present, but Ga and Sb are hardly present.

Oxygen contained in a mixed solution used for removing a damaged layer or oxygen contained in a gas used for forming the protective layer 21 may be contained in the amorphous layer 20.

The thickness of the amorphous layer 20 (thickness in a direction parallel to the upper surface of the substrate 11) is preferably 5 nm or more and 50 nm or less, more preferably 10 nm or more and 45 nm or less, and still more preferably 15 nm or more and 40 nm or less. In a case where the amorphous layer 20 is too thin, there is a possibility that, when the protective layer 21 is formed or the like, the infrared absorption layer 15 and the electron barrier layer 14 covered with the amorphous layer 20 are oxidized and Sb oxide is easily generated. In a case where the amorphous layer 20 is too thick, there is a possibility that the amount of reduction of crystalline GaSb layers constituting a superlattice is large and the surface flatness is deteriorated, formation of the protective layer 21 is insufficient, and dark current due to process damage increases.

The infrared absorption layer 15 may include an InSb layer as a strain compensation layer between the InAs layer 15A and the GaSb layer 15B. For example, the thickness of an InSb layer is 0.2 nm. An InSb layer may relieve strain caused by the difference in lattice constant between the substrate 11 and the InAs layer 15A. An InSb layer may be provided between all of the InAs layers 15A and the GaSb layers 15B, or may be provided for each cycle (set) of the InAs layers 15A and the GaSb layers 15B. Similarly, the electron barrier layer 14 and the hole barrier layer 16 may include an InSb layer as a strain compensation layer.

Second Embodiment

Figure 10:
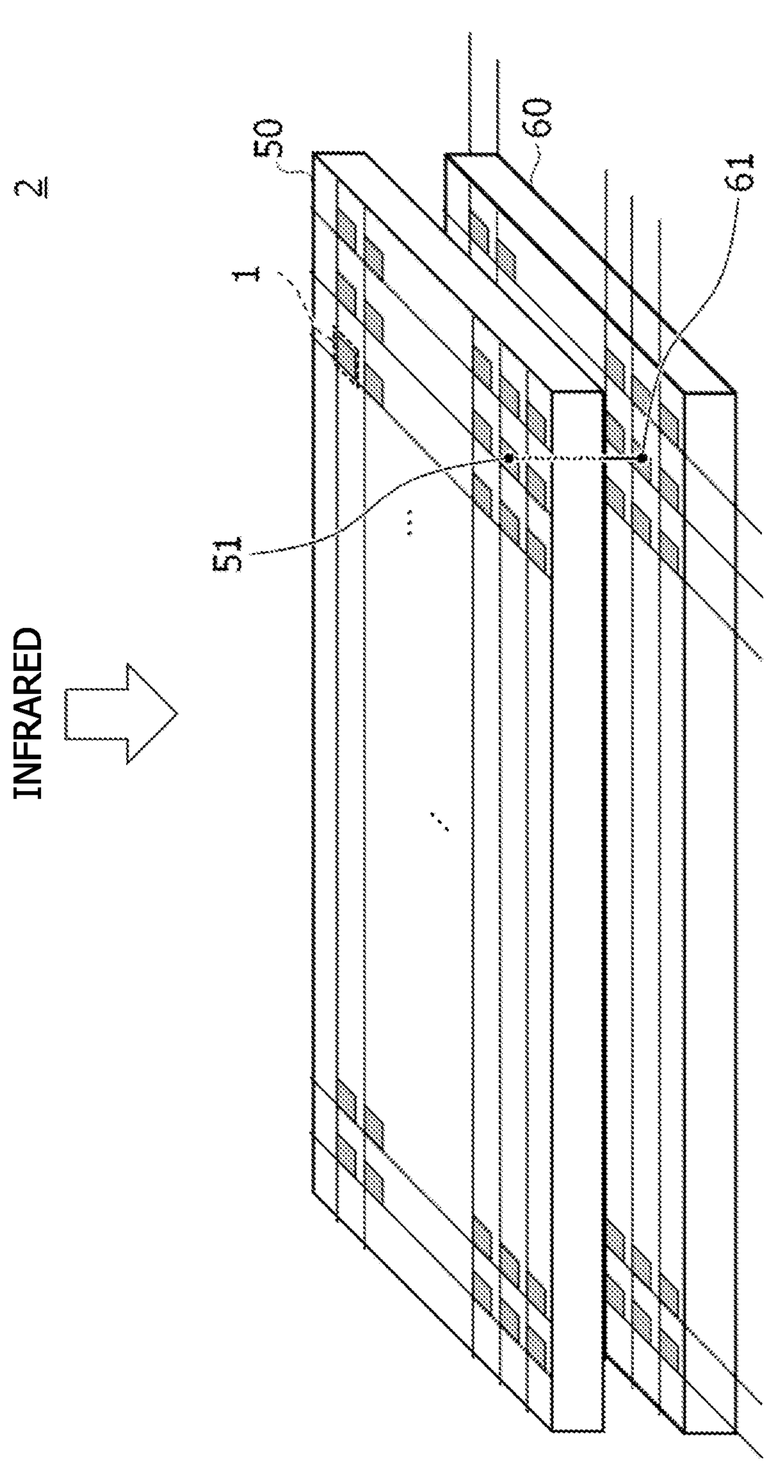
FIG. 10 is a schematic diagram illustrating an infrared imaging device according to a second embodiment.

A second embodiment will be described. The second embodiment relates to an infrared imaging device including a light receiving element 1. FIG. 10 is a schematic diagram illustrating the infrared imaging device according to the second embodiment.

An infrared imaging device 2 according to the second embodiment includes a pixel array 50 and a readout circuit (ROIC) 60. The pixel array 50 includes a plurality of light receiving elements 1 arranged in an array. Each light receiving element 1 constitutes one pixel 51. The pixel array 50 and the readout circuit 60 are flip-chip bonded. Each pixel 51 is electrically coupled to a corresponding unit cell 61 formed in the readout circuit 60 by a bonding electrode 27 (see FIG. 13). The infrared imaging device 2 includes a focal plane array (FPA).

Figure 11:
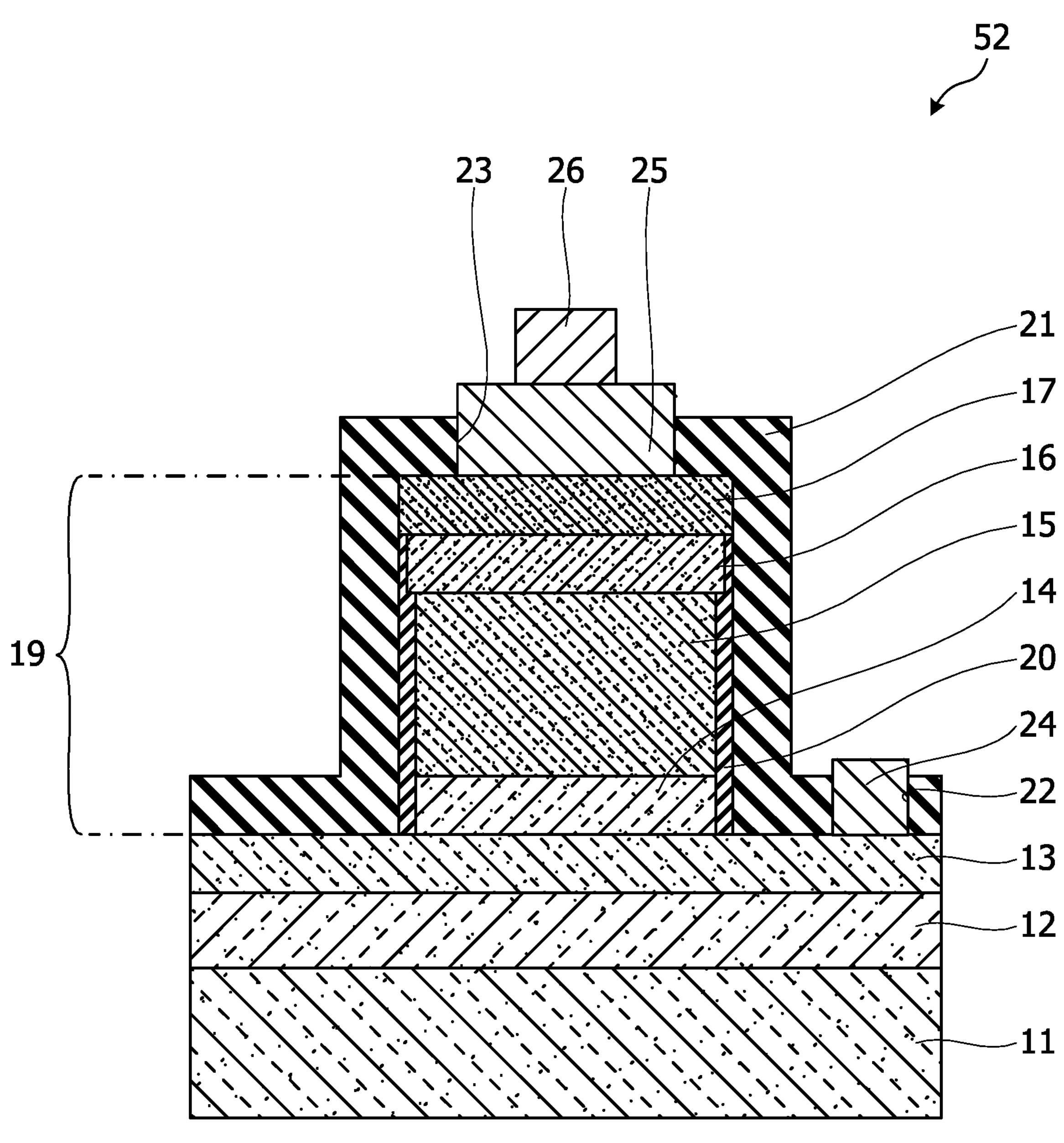
FIG. 11 is a sectional view (part 1) illustrating a method of manufacturing the infrared imaging device according to the second embodiment.
Figure 12:
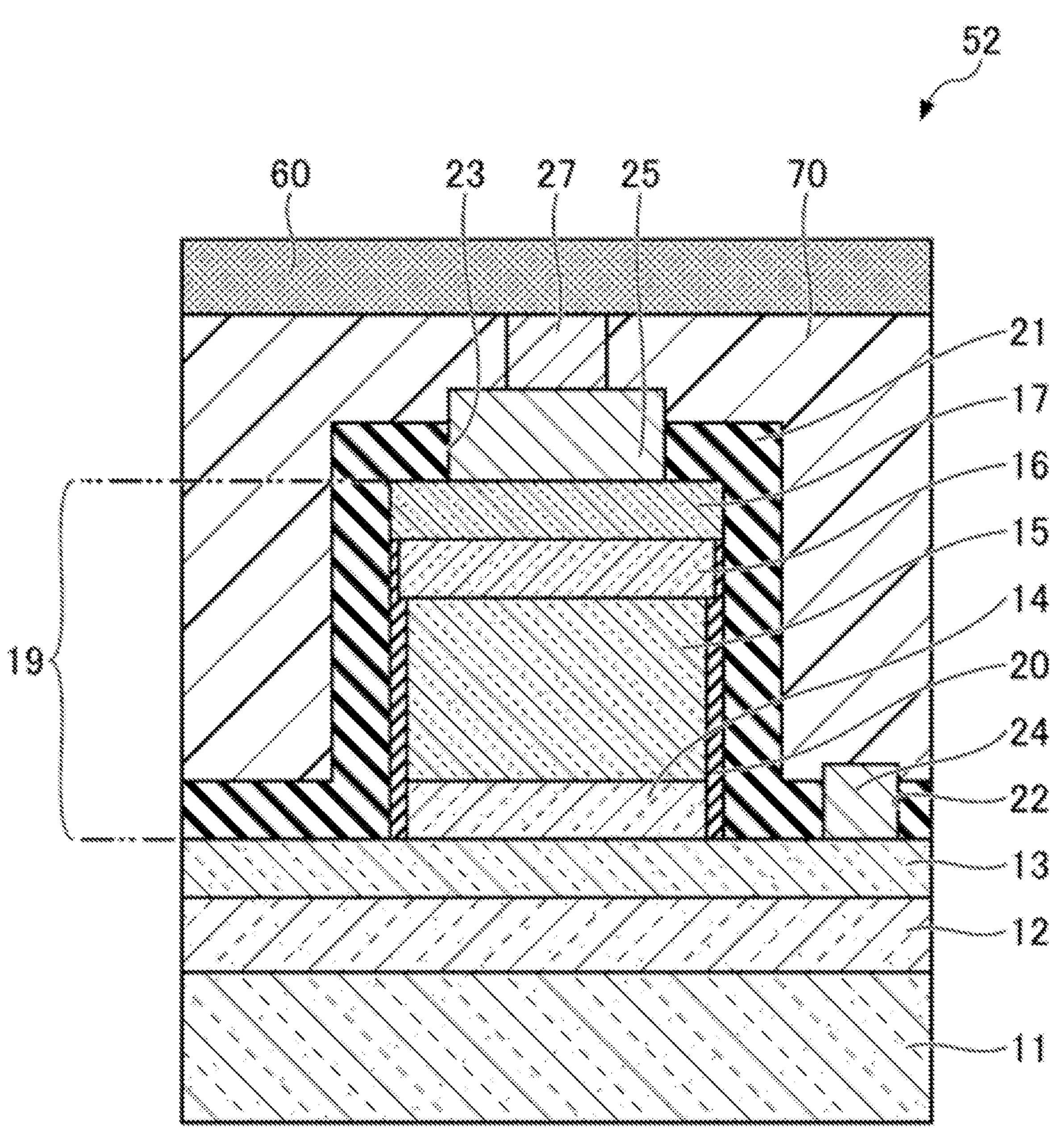
FIG. 12 is a sectional view (part 2) illustrating the method of manufacturing the infrared imaging device according to the second embodiment.
Figure 13:
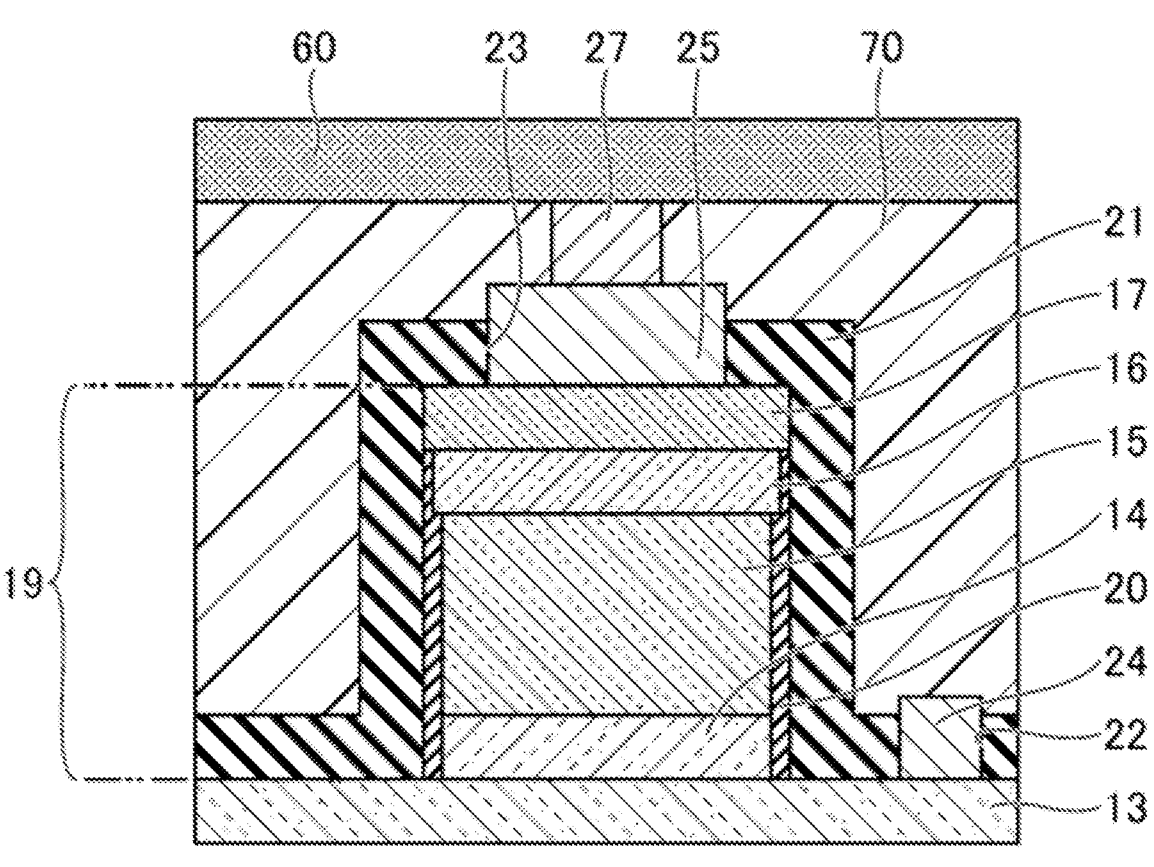
FIG. 13 is a sectional view (part 3) illustrating the method of manufacturing the infrared imaging device according to the second embodiment.

Next, a method of manufacturing the infrared imaging device 2 according to the second embodiment will be described. FIG. 11 to FIG. 13 are sectional views illustrating the method of manufacturing the infrared imaging device 2 according to the second embodiment.

First, processing up to the formation of the lower electrode 24 and the upper electrode 25 is performed in accordance with the first embodiment. At this time, a plurality of mesas 19 is formed in an array over one substrate 11. A mesa for dummy pixel is formed around the pixel 51 in addition to the mesa 19 constituting the pixel 51. Lead wiring is formed on the side wall of the mesa for dummy pixel, and the lower electrode 24 is coupled to an upper electrode included in the mesa for dummy pixel. The lower electrode 24 is used as a common electrode for the plurality of pixels 51 forming a corresponding column or row of the pixel array 50.

After the formation of the lower electrode 24 and the upper electrode 25, as illustrated in FIG. 11, a bump electrode 26 is formed over the upper electrode 25. For example, the bump electrode 26 is an In electrode. For example, the bump electrode 26 may be formed by a lift-off method in which lithography and a vapor deposition method are combined. In this manner, a temporary pixel array 52 is formed.

Next, as illustrated in FIG. 12, the temporary pixel array 52 and the readout circuit 60 including a coupling electrode (not illustrated) are flip-chip bonded. At the time of this flip-chip bonding, the bonding electrode 27 is formed from the bump electrode 26 and the coupling electrode. After that, an underfill 70 is filled between the temporary pixel array 52 and the readout circuit 60.

Subsequently, the rear surface of the substrate 11 is ground until the thickness of the substrate 11 is, for example, 50 μm. Next, as illustrated in FIG. 13, the remaining substrate 11 and the buffer layer 12 are removed by wet etching with a mixed solution containing HF and $CrO_3$ while using the lower contact layer 13 as an etching stopper.

After that, an anti-reflection film is formed on the rear surface of the lower contact layer 13 serving as an infrared ray incidence surface, and the device is mounted in a container. In this manner, the infrared imaging device 2 may be manufactured.

According to the second embodiment, since the light receiving element 1 according to the first embodiment is included, the peripheral components of dark current are reduced, an excellent S/N ratio is obtained, and a clear image having high temperature resolution may be obtained with a fine and high-definition configuration.

The wavelength of an infrared ray to be a light receiving target is not particularly limited. For example, an infrared ray with a wavelength of 1.4 μm to 30 μm may be a light receiving target, for example, an infrared ray with a wavelength of 1.4 μm to 15 μm may be a light receiving target. The thickness of the InAs layers 15A and the GaSb layers 15B may be adjusted according to the wavelength of an infrared ray to be a light receiving target. Also for the electron barrier layer 14 and the hole barrier layer 16, the thickness of the compound semiconductor layers constituting a superlattice may be adjusted according to the wavelength of an infrared ray to be a light receiving target. The configuration of the superlattice included in the electron barrier layer 14 and the hole barrier layer 16 is not particularly limited. For example, the superlattice included in the hole barrier layer 16 may have a configuration in which an InAs layer, a GaSb layer, an AlSb layer, and a GaSb layer are laminated in this order. The conductivity type of the light receiving layer may be an n-type. In this case, an AlGaSb layer or the like may be used as the electron barrier layer.

For example, the light receiving element, the infrared imaging device, and the like may be used for nighttime navigation in a ship or may be used for nondestructive inspection of concrete.

Although the preferred embodiments and the like have been described in detail above, the present disclosure is not limited to the above-described embodiments and the like. Various modifications and replacements may be made to the above-described embodiments and the like without departing from the scope of the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A light receiving element comprising:

a light receiving layer that includes a superlattice of an InAs layer and a GaSb layer; and an amorphous layer that covers a side wall surface of the light receiving layer, wherein the amorphous layer contains In and As, and an amount of Ga and an amount of Sb contained in the amorphous layer are smaller than an amount of In and an amount of As contained in the amorphous layer.

2. The light receiving element according to claim 1, wherein the amorphous layer further contains oxygen.

3. The light receiving element according to claim 1, wherein an amount of Ga and an amount of Sb contained in the amorphous layer are both 10 atomic % or less.

4. The light receiving element according to claim 1, wherein a thickness of the amorphous layer is 5 nm or more and 50 nm or less.

5. The light receiving element according to claim 1, wherein a side wall surface of the GaSb layer is located inside a side wall surface of the InAs layer in plan view from a thickness direction.

6. The light receiving element according to claim 1, wherein the light receiving layer includes an InSb layer between the InAs layer and the GaSb layer.

7. The light receiving element according to claim 1, wherein an n-type hole barrier layer that includes a superlattice of an InAs layer and an AlSb layer and is in contact with one surface of the light receiving layer, and a protective layer that covers a side wall surface of the hole barrier layer are included, and a distance between the hole barrier layer and the protective layer is 3 nm or less.

8. The light receiving element according to claim 7, wherein a p-type electron barrier layer that includes a superlattice of an InAs layer and a GaSb layer and is in contact with another surface of the light receiving layer, is included, and a side wall surface of the electron barrier layer is covered with the amorphous layer.

9. An infrared imaging device comprising:

the light receiving element according to claim 1; and a readout circuit coupled to the light receiving element.

* * * * *